United States Patent
Moritz

(10) Patent No.: US 6,443,440 B1
(45) Date of Patent: Sep. 3, 2002

(54) DEVICE FOR UNILATERAL ETCHING OF A SEMICONDUCTOR WAFER

(76) Inventor: Hans Moritz, Lindenbergstrasse 30, D-34253 Lohfelden (DE)

( * ) Notice: Subject to any disclaimer, the term of this patent is extended or adjusted under 35 U.S.C. 154(b) by 0 days.

(21) Appl. No.: 09/564,158

(22) Filed: May 3, 2000

(30) Foreign Application Priority Data

May 15, 1999 (DE) .......................... 199 22 498

(51) Int. Cl.[7] .................................. B25B 11/00
(52) U.S. Cl. .................. 269/21; 269/903; 156/345; 204/298; 118/500
(58) Field of Search .................. 269/287, 903, 269/21, 208; 206/312, 328, 445, 303, 8; 156/365; 204/298, 298.01, 192; 118/500

(56) References Cited

U.S. PATENT DOCUMENTS

| | | | | |
|---|---|---|---|---|
| 3,583,694 A | * | 6/1971 | Davies | 269/98 |
| 3,630,804 A | * | 12/1971 | Coffman | 156/345 |
| 4,403,567 A | * | 9/1983 | DaCosta | 118/500 |
| 4,473,455 A | * | 9/1984 | Dean | 204/298 |
| 4,500,080 A | * | 2/1985 | Aigo | 269/56 |
| 4,551,192 A | * | 11/1985 | DiMilia | 156/345 |
| 5,029,555 A | * | 7/1991 | Dietrich | 118/730 |
| 5,280,894 A | * | 1/1994 | Witcraft | 269/287 |
| 5,733,426 A | * | 3/1998 | Cox | 204/298.01 |
| 5,895,549 A | * | 4/1999 | Goto | 156/345 |
| 5,904,800 A | * | 5/1999 | Mautz | 156/345 |

FOREIGN PATENT DOCUMENTS

| | | |
|---|---|---|
| DE | 4024576 A1 | 2/1992 |
| DE | 19728962 A1 | 1/1999 |
| DE | 197 28 962 | 1/1999 |

* cited by examiner

Primary Examiner—Joseph J. Hail, III
Assistant Examiner—Daniel Shanley
(74) Attorney, Agent, or Firm—Herbert Dubno

(57) ABSTRACT

A device for holding a semiconductor wafer for unilateral etching has a base plate with a central hole around which a first seal bears against the side of the wafer to be etched along its perimeter. The back is closed by a lid extending beyond the wafer and bearing with a second annular seal against the plate.

5 Claims, 2 Drawing Sheets

Fig.2
Fig.3
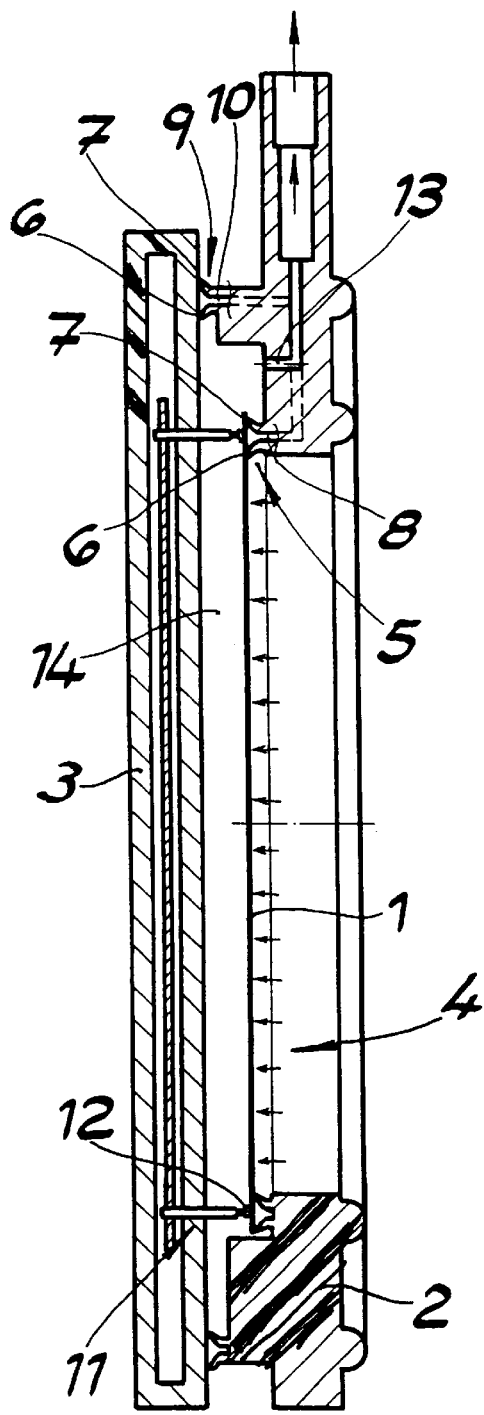
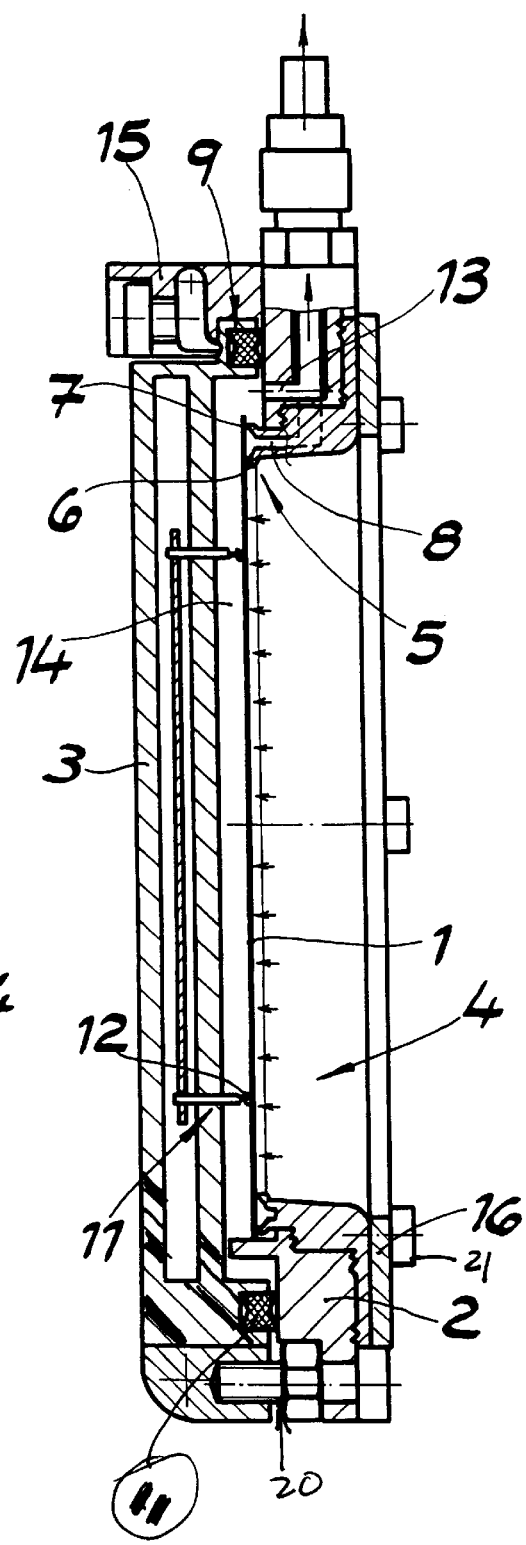

DEVICE FOR UNILATERAL ETCHING OF A SEMICONDUCTOR WAFER

FIELD OF THE INVENTION

My present invention relates to a device for the unilateral etching of a semiconductor wafer and, more particularly, to a device for holding a semiconductor wafer for unilateral etching, i.e. etching from only one side of that wafer.

BACKGROUND OF THE INVENTION

The holding of a semiconductor wafer for unilateral etching generally is effected with a holding plate or base member having a central opening through which the semiconductor wafer is etched in a type of etching cell. That central opening is smaller than the semiconductor wafer and elastic seals are provided around the central opening and the space between the seals can be subjected to suction.

A device of this type is described in German Patent Document DE 197 28 962 A1. In this system, the sealing arrangement is provided on the side of the base member opposite that along which a lid, which covers the back of the base member is provided. Consequently, when the semiconductor wafer on this holder is immersed in the etching medium, it is subjected to an etching effect not only in an edge or perimetral zone of the wafer but also on that portion of the back of the wafer outwardly of the sealing arrangement. This attack by the etching arrangement along the periphery of the wafer and on its back is undesirable in many cases and may even obstruct further processing of the wafer.

OBJECTS OF THE INVENTION

It is, therefore, the principal object of the present invention to provide a device for holding a semiconductor wafer for etching in, for example, an etching cell arrangement, whereby there is no attack on the periphery of the wafer or when any attack by the etching medium on the periphery or back of the wafer is substantially reduced.

Another object of this invention is to provide a device for the purposes described which is free from drawbacks of the earlier system mentioned.

SUMMARY OF THE INVENTION

These objects and others which will become apparent hereinafter are attained, in accordance with the present invention by providing the sealing arrangement on a side of the base member or plate which faces the lid and thus engages the face of the wafer to be etched along its periphery or at its perimeter while the lid engages over the sealing arrangement and the semiconductor wafer held thereon and is held releasably on the base member via a second annular seal.

According to the invention, therefore, the device for holding the semiconductor wafer for unilateral etching can comprise:

a base plate formed with a central opening through which an etching medium can contact a semiconductor wafer to be unilaterally etched, the base plate being formed with a first annular seal formed by two elastic seals surrounding the opening and adapted to bear upon a side of the wafer to be etched along a perimeter thereof;

a vacuum conduit opening into a space between the elastic seals for applying suction to the side of the wafer and retain the wafer against the sealing lips, the side of the wafer being exposed to the etching medium inwardly of the first annular seal;

a lid releasably held on the plate and closing the central opening behind the wafer; and a second annular seal between the lid and the plate, whereby an edge zone and back of the wafer are protected from attack by the etching medium.

The elastic seals can be lip seals and the second annular seal in turn can be comprised of lip seals.

An advantage of this arrangement is that with a very simple structure only the zone located within the first annular seal is subjected to the action of the etching agent and only one side of the wafer is thereby etched. The edge zone and back of the wafer are completely protected from the etching agent and cannot be attacked or damaged.

In one embodiment of the invention, the lid can be mounted pivotally on the base member and it has been found to be advantageous further to form the second annular seal from lip seals which are arranged in spaced relationship concentrically around the first sealing arrangement and by providing a further suction conduit which opens between these two elastic seals as well. This greatly facilitates handling in the mounting and removal of a wafer in the device.

While the base member can be made in one piece with the seals, e.g. from a plastic with sufficient flexibility and resistance to the etching medium, it has been found to be more cost effective in the long run if at least one and preferably both of the annular seal arrangements are removable from the base member or are held replaceably thereon or on the lid which itself is removable from the base member.

The lid can be provided with a contact spring arrangement whose contact springs bear against the semiconductor wafer. The use of contact springs has been described in DE 197 28 962 A1.

An etching electrode arrangement can also be integrated in the base member. It has been found to be advantageous, moreover, to provide the base member with at least one duct which permits pressure equalization between a chamber formed between the lid and the wafer with the ambient atmosphere, thereby avoiding damage to the wafer during etching. In the absence of such pressure equalization or venting, high temperature gradients which may occur during etching can cause pressure build-up in the aforementioned chamber and damage to the wafer.

BRIEF DESCRIPTION OF THE DRAWING

The above and other objects, features, and advantages will become more readily apparent from the following description, reference being made to the accompanying drawing in which:

FIG. 2 is a cross section through the device of FIG. 1; and

FIG. 3 is a section similar to FIG. 2 through another embodiment of the device of the invention.

SPECIFIC DESCRIPTION

Figure 1:
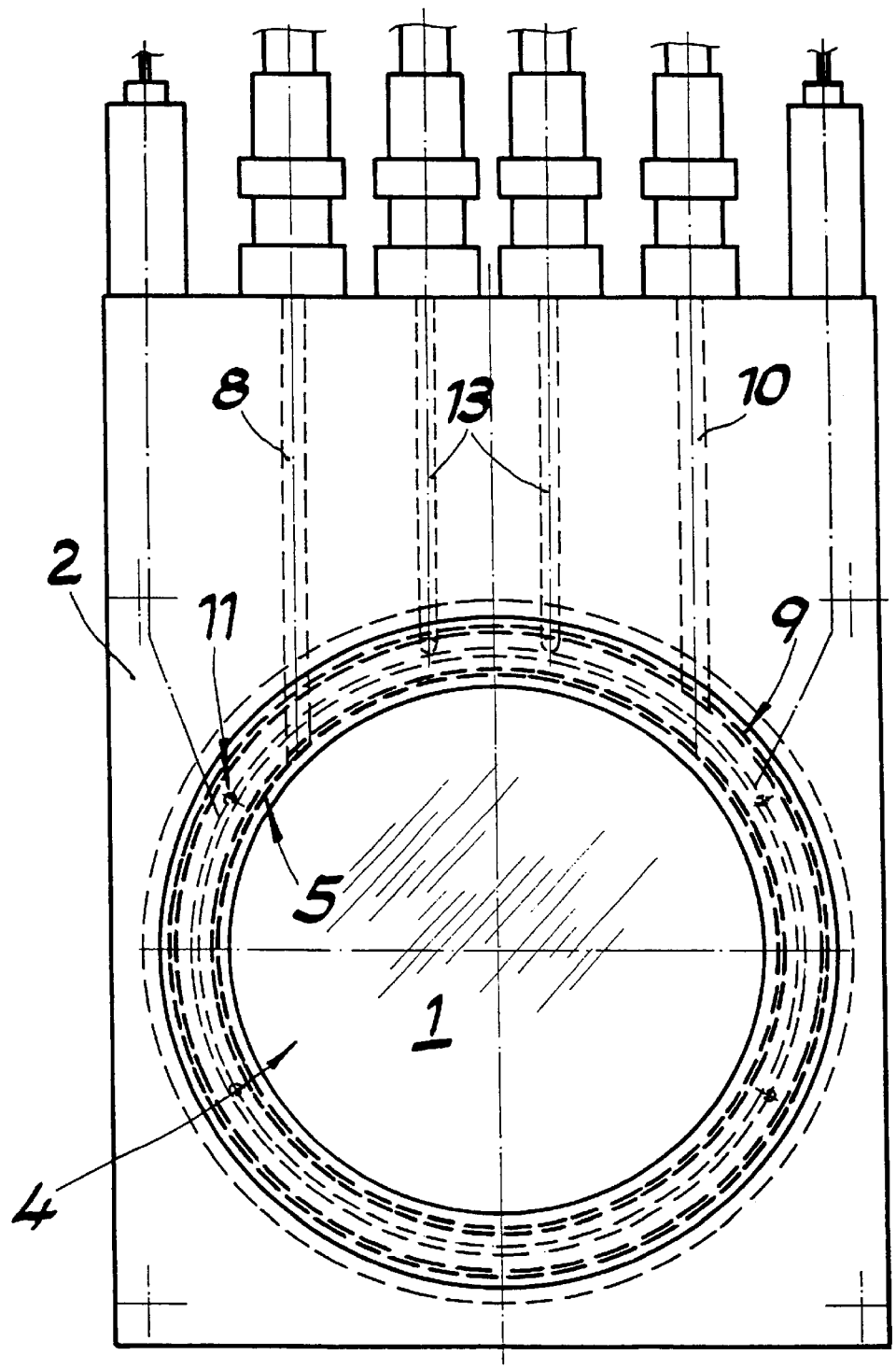
FIG. 1 is a plan view of a device for holding a semiconductor wafer for the unilateral etching thereof in an etching cell arrangement.

The devices shown in the drawing serve for the unilateral etching of a semiconductor wafer 1, namely, a silicon wafer. The device comprises a plate-shape base member 2 which can be composed of a synthetic resin material resistant to the etching agent or bath and which can be fastened unilaterally with sealing lips of suitable flexibility. A nylon-type polyamide can serve for this purpose. The other main element of the device is a lid 3 which may also be composed of a synthetic resin material resistant to the etching bath, e.g. nylon, the lid 3 being so dimensioned that it extends beyond on central circular opening 4 of the plate 2.

The central opening 2 has a diameter which is smaller than the diameter of the circular wafer 1. The lid closes the central opening 4 on one side of the base member 2 and is held releasably on the base member 2 by suction and/or a clamping device as will be described in greater detail below.

The semiconductor wafer 1 is held on the base member 2 by a first annular seal 5 which is comprised of two elastic seals 6, 7 disposed in spaced relationship concentrically around the central opening 4. A vacuum conduit 8 formed in the base member 2 opens into the space with the elastic seal 6, 7 and retains the face of the wafer 1 to be etching against the seals 6, 7 along the periphery of the wafer.

In both of the embodiments illustrated, the first annular seal 5 is disposed on the side of the base member 2 facing the lid and the lid 3 is provided to overlie the back of the wafer and is sealed with respect to the base member with a second annular seal 9. The lid 3 is thus held releasably on the base member 2 with interposition of the second annular seal 9. The annular seal 9 may, as provided in FIG. 2, comprise elastic seal 6, 7, between which a suction conduit 11 opens. The elastic seals 6, 7, of both embodiments are preferably formed as lip seals.

In each embodiment, moreover, the lid 3 has a conventional contact spring arrangement 11 with contact springs 12 which bear against the back of the wafer 1. The base member 2 is also provided with two ducts 13 which communicate between the lid chamber 14, formed between the lid 3 and the wafer 1, and the ambient atmosphere. Thus pressure equalization with the space behind the wafer can be effected or a protective gas can be introduced to scavenge any detrimental or noxious gases which might effect the back of the wafer, for maintaining the back of the wafer dry can be circulated through this chamber.

In the embodiment of FIGS. 1 and 2, the lid 3 is held on the base member by the suction of the second seal 9. The base member 2 and its first and second annular seals are shown to be of one piece in FIG. 2. In the embodiment of FIG. 3 the lid 3 is mounted on the base member 2 so as to be pivotable thereon. A pivot arrangement is represented at 20 in FIG. 3 for this purpose. The lid, when in position, can be pressed against the base member 2 by affixing yoke 15 and here the annular seal 9 is comprised of a sealing ring removably mounted in the lid 3. In addition, the first annular seal 2 is removably mounted on the base member 2 and is held in place thereon by a clamping ring 16 secured by screws 21.

I claim:

1. A device for holding a semiconductor wafer for unilateral etching, comprising:

a base plate formed with a central opening through which an etching medium can contact a semiconductor wafer to be unilaterally etched, said base plate being formed with a first annular seal formed by two elastic seals concentrically surrounding said opening and adapted to bear upon a side of the wafer to be etched along a perimeter thereof;

a vacuum conduit opening into a space between said elastic seals for applying suction to said side of said wafer and retain said wafer against said sealing lips, said side of said wafer being exposed to said etching medium inwardly of said first annular seal;

a lid releasably held on said plate and closing said central opening behind said wafer; and a second annular seal between said lid and said plate concentric with said opening and said first annular seal, whereby an edge zone and back of said wafer are protected from attack by said etching medium, said second annular seal comprising two elastic seals formed in said plate and engaging said lid, and a suction conduit opening between the elastic seals of said second annular seal and holding said lid against said plate by suction.

2. The device defined in claim 1 wherein said elastic seals are lip seals.

3. The device defined in claim 2, further comprising a contact spring arrangement in said lid bearing on said back of said wafer.

4. The device defined in claim 2 wherein said wafer defines a chamber with said lid, said device further comprising at least one duct opening into said chamber for relieving pressure therein.

5. The device defined in claim 2 wherein at least one of said first and second annular seals is removable.

* * * * *